(12) United States Patent
Ueta et al.

(10) Patent No.: US 9,899,213 B2
(45) Date of Patent: Feb. 20, 2018

(54) GROUP III NITRIDE SEMICONDUCTOR, AND METHOD FOR PRODUCING SAME

(71) Applicant: Panasonic Corporation, Osaka (JP)

(72) Inventors: Akio Ueta, Hyogo (JP); Akihiko Ishibashi, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/428,657

(22) Filed: Feb. 9, 2017

(65) Prior Publication Data

US 2017/0338101 A1   Nov. 23, 2017

(30) Foreign Application Priority Data

May 20, 2016 (JP) ................. 2016-101456

(51) Int. Cl.
*H01L 33/00* (2010.01)
*H01L 21/02* (2006.01)
*C30B 25/18* (2006.01)
*C30B 29/40* (2006.01)
*C30B 29/22* (2006.01)
*H01L 33/32* (2010.01)
*H01L 33/12* (2010.01)

(52) U.S. Cl.
CPC ........ *H01L 21/0254* (2013.01); *C30B 25/183* (2013.01); *C30B 29/22* (2013.01); *C30B 29/406* (2013.01); *H01L 21/0237* (2013.01); *H01L 21/02046* (2013.01); *H01L 21/0262* (2013.01); *H01L 21/02458* (2013.01); *H01L 21/02598* (2013.01); *H01L 33/12* (2013.01); *H01L 33/32* (2013.01); *H01L 21/0242* (2013.01); *H01L 21/02425* (2013.01); *H01L 33/007* (2013.01)

(58) Field of Classification Search
CPC ........ H01L 33/12; H01L 33/32; C30B 25/183
USPC .................................... 257/96, 97
See application file for complete search history.

(56) References Cited

U.S. PATENT DOCUMENTS

| | | | |
|---|---|---|---|
| 2009/0075481 A1* | 3/2009 | Chen | H01L 21/02472 438/694 |
| 2013/0244364 A1 | 9/2013 | Gardner et al. | |
| 2015/0115299 A1* | 4/2015 | Grundmann | H01L 21/0237 257/96 |

FOREIGN PATENT DOCUMENTS

| | | |
|---|---|---|
| JP | 2007-335484 A | 12/2007 |
| JP | 2012-227456 A | 11/2012 |
| JP | 2013-542608 A | 11/2013 |
| JP | 2013-544436 A | 12/2013 |
| JP | 2015-178448 | 10/2015 |

\* cited by examiner

*Primary Examiner* — David Vu
*Assistant Examiner* — Brandon Fox
(74) *Attorney, Agent, or Firm* — McDermott Will & Emery LLP

(57) ABSTRACT

On an RAMO$_4$ substrate containing a single crystal represented by the general formula RAMO$_4$ (wherein R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd), a buffer layer containing a nitride of In and a Group III element except for In is formed, and a Group III nitride crystal is formed on the buffer layer.

12 Claims, 10 Drawing Sheets

GROUP III NITRIDE SEMICONDUCTOR, AND METHOD FOR PRODUCING SAME

TECHNICAL FIELD

The technical field relates to a Group III nitride semiconductor, and a method for producing the same.

BACKGROUND

A Group III nitride semiconductor can cover a wide range of band gaps by changing the composition of Ga, Al, In, and the like, which are Group III elements, and therefore is widely applied to optical semiconductor devices, such as an LED (light emitting diode) and an LD (semiconductor laser), electronic devices for high frequency and high output power purposes. In general, the devices are produced by epitaxially growing a Group III nitride crystal on a sapphire substrate.

However, the lattice mismatch ratio between a sapphire substrate and a GaN crystal, which is a Group III nitride semiconductor, (((lattice constant of GaN)−(lattice constant of sapphire))/(lattice constant of GaN)) is 13.8%, and thus the Group III nitride crystal thus epitaxially grown has a large defect density. Accordingly, there has been a problem that the characteristics of the device using the Group III nitride semiconductor are restricted.

In view of the problem, for reducing the defect density of the Group III nitride crystal, there has been a proposal of a technique of epitaxially growing GaN on a substrate formed of $ScAlMgO_4$ (Patent Literature 1). The lattice mismatch ratio between $ScAlMgO_4$ and GaN (((lattice constant of GaN)−(lattice constant of $ScAlMgO_4$))/(lattice constant of GaN)) is as small as −1.8%. Under the circumstances, there is an expectation of application to various devices of a Group III nitride semiconductor that uses a single crystal represented by $RAMO_4$ (wherein R represents one or a plurality of trivalent elements selected from the group consisting of Sc, In, Y, and a lanthanoid element, A represents one or a plurality of trivalent elements selected from the group consisting of Fe(III), Ga, and Al, and M represents one or a plurality of divalent elements selected from the group consisting of Mg, Mn, Fe(II), Co, Cu, Zn, and Cd) (which may be hereinafter referred to as an "$RAMO_4$ substrate"), examples of which include $ScAlMgO_4$, as a substrate for epitaxial growth of a Group III nitride crystal.

Patent Literature 1: JP-A-2015-178448

SUMMARY

However, there is a problem that when a substrate formed of an $RAMO_4$ crystal is used for a Group III nitride semiconductor, a part of the constitutional elements of the substrate are mixed in the crystal of the Group III nitride, thereby deteriorating the crystallinity of the Group III nitride.

In view of this problem, as well as other concerns, an object herein is to provide a Group III nitride semiconductor with high quality.

For achieving the aforementioned and other objects, there is provided, as one aspect, a Group III nitride semiconductor containing: an $RAMO_4$ substrate containing a single crystal represented by the general formula $RAMO_4$ (wherein R represents one or a plurality of trivalent elements selected from the group consisting of Sc, In, Y, and a lanthanoid element, A represents one or a plurality of trivalent elements selected from the group consisting of Fe(III), Ga, and Al, and M represents one or a plurality of divalent elements selected from the group consisting of Mg, Mn, Fe(II), Co, Cu, Zn, and Cd); a buffer layer formed on the $RAMO_4$ substrate, containing a nitride of In and a Group III element except for In; and a Group III nitride crystal formed on the buffer layer.

According to the aspect, a Group III nitride semiconductor with high quality can be provided.

DESCRIPTION OF EMBODIMENTS

A Group III nitride semiconductor according to one aspect will be described with reference to the drawings.

Group III Nitride Semiconductor

The Group III nitride semiconductor of the aspect has a structure containing a $RAMO_4$ substrate, a buffer layer formed on the substrate, and a Group III nitride crystal formed on the buffer layer. One of the features of the Group III nitride semiconductor of the aspect is that the buffer layer contains a nitride of In and a Group III element except for In.

In the case where a Group III nitride crystal is produced directly on an $RAMO_4$ substrate, as described above, a part of the constitutional elements of the $RAMO_4$ substrate tend to be mixed in the Group III nitride crystal during the epitaxial growth, which provides a problem that the crystallinity of the Group III nitride crystal tends to be deteriorated. In the aspect, on the other hand, the buffer layer containing a nitride of In and a Group III element except for In provided on the $RAMO_4$ substrate prevents the elements derived from the $RAMO_4$ substrate from being mixed in the Group III nitride crystal. Consequently, a Group III nitride semiconductor containing a Group III nitride crystal with high quality can be obtained.

For the Group III nitride semiconductor of the aspect, an embodiment where as $ScAlMgO_4$ substrate is used as the $RAMO_4$ substrate will be described below, but the $RAMO_4$ substrate capable of being used in the aspect is not limited to the $ScAlMgO_4$ substrate.

Figure 1:
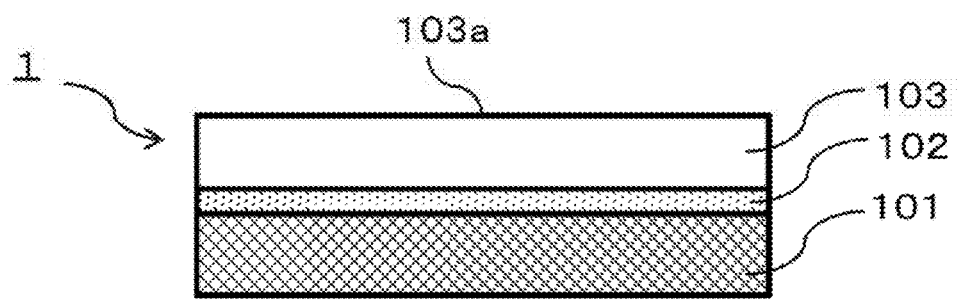
FIG. 1 is a schematic cross sectional view showing a Group III nitride semiconductor according to one embodiment.

FIG. 1 is a schematic cross sectional view showing a Group III nitride semiconductor according to the embodiment. The Group III nitride semiconductor 1 contains: an $ScAlMgO_4$ substrate 101 containing an $ScAlMgO_4$ crystal; a buffer layer 102 formed on the $ScAlMgO_4$ substrate 101, containing a nitride of In and a Group III element except for In; and a Group III nitride crystal 103 formed on the buffer layer 102.

The $ScAlMgO_4$ substrate 101 is a substrate formed of a $ScAlMgO_4$ single crystal. The $ScAlMgO_4$ single crystal has a structure containing an $ScO_2$ layer having a rock salt structure and an $AlMgO_2$ layer having a hexagonal structure, and has a property of cleavage at the (0001) plane (cleavage surface), as similar to graphite and hexagonal BN. The Group III nitride crystal 103 of the Group III nitride semiconductor of the embodiment can be obtained by epitaxially growing on the cleavage surface of the $ScAlMgO_4$ substrate 101.

The lattice mismatch ratio between $ScAlMgO_4$ and GaN, which is a Group III nitride, (((lattice constant of GaN)−(lattice constant of $ScAlMgO_4$)/(lattice constant of GaN)) is as small as −1.8%. The smallness of the lattice mismatch ratio is effective for reducing crystal defects. The difference in thermal expansion coefficient between $ScAlMgO_4$ and GaN (((thermal expansion coefficient of GaN)−(thermal expansion coefficient of $ScAlMgO_4$))/(thermal expansion coefficient of GaN)) is also as small as approximately 10.9%. Accordingly, the Group III nitride crystal 103 having less defects can be formed by using the $ScAlMgO_4$ substrate 101.

The thickness of the $ScAlMgO_4$ substrate 101 in the Group III nitride semiconductor of the embodiment is not particularly limited, and may be appropriately selected depending on the purpose of the Group III nitride semiconductor, and the thickness is preferably approximately from 100 to 1,000 μm, and more preferably from 300 to 600 μm. When the thickness of the $ScAlMgO_4$ substrate 101 is in the range, the strength of the $ScAlMgO_4$ substrate 101 can be sufficiently enhanced to prevent the Group III nitride crystal 103 from suffering cracks and the like in the production thereof. The shape of the $ScAlMgO_4$ substrate 101 is not particularly limited, and is preferably in the form of a wafer having a diameter of approximately from 50 to 150 mm in consideration of the industrial practicality.

The buffer layer 102 is a layer containing a nitride of In and a Group III element except for In, and may be an amorphous, single crystal, or polycrystalline layer formed of a compound having a composition shown by InGaN, as shown in the examples described later. Furthermore, as shown in the examples described later, the buffer layer 102 preferably further contains Al, and is more preferably an amorphous, single crystal, or polycrystalline layer formed of a compound shown by InAlGaN. The buffer layer 102 may be in an amorphous or polycrystalline state in the accumulation thereof in many cases, and in the formation of the Group III nitride crystal 103 on the buffer layer 102, the amorphous or polycrystalline state of the buffer layer 102 may be converted to a single crystal through recrystallization and grain growth due to the temperature of the formation of the Group III nitride crystal 103 in some cases.

Figure 2:
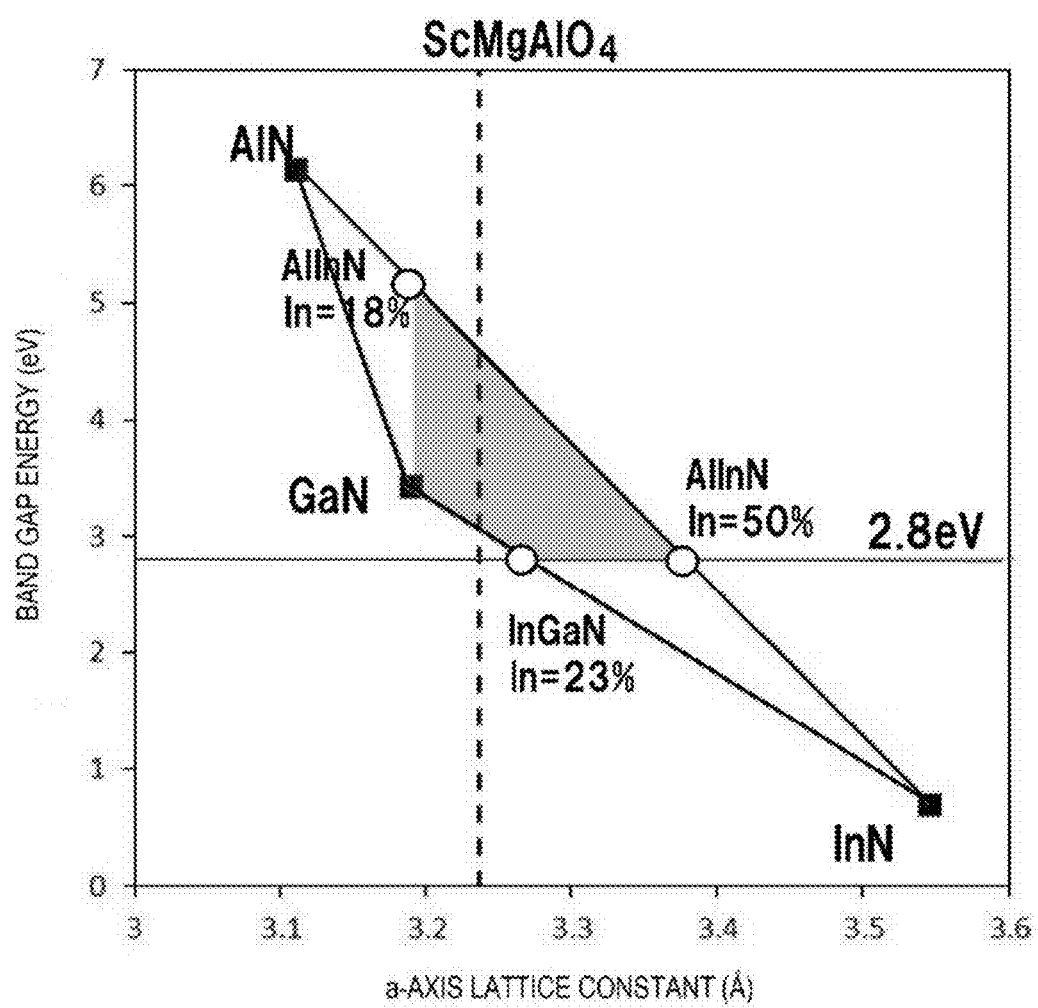
FIG. 2 is a graph showing the relationship between the band gap energy and the lattice constant of the Group III nitride semiconductor in one embodiment.

The use of InAlGaN as the buffer layer 102 can decrease the lattice mismatch ratio between the $ScAlMgO_4$ substrate 101 and the Group III nitride crystal 103. FIG. 2 shows the relationship between the a-axis lattice constant and the band gap energy for a GaN single crystal, an InN single crystal, and an AlN single crystal. In FIG. 2, the ordinate shows the band gap energy (eV), and the abscissa shows the a-axis lattice constant (Å). The broken line shows the a-axis lattice constant of $ScAlMgO_4$. The a-axis lattice constant of $ScAlMgO_4$ passes through the triangle formed by the a-axis lattice constants of the GaN single crystal, the InN single crystal, and the AlN single crystal. Therefore, the lattice constant of the buffer layer 102 can be made close to the lattice constant of the $ScAlMgO_4$ substrate 101 by adjusting the compositional ratios of Al, In, Ga, and N in the buffer layer 102, and thereby the lattice mismatch ratio between the $ScAlMgO_4$ substrate 101 and the Group III nitride crystal 103 can be made small.

The diffusion of Mg derived from $ScAlMgO_4$ in the Group III nitride crystal tends to cause problems including deterioration of the crystallinity and reduction of the conductivity controllability of the Group III nitride crystal. The increase of the In proportion in the buffer layer 102 effectively prevents the diffusion of Mg contained in $ScAlMgO_4$. However, as shown in FIG. 2, the excessive increase of the In proportion in the buffer layer 102 may be a factor increasing the lattice mismatch ratio between the $ScAlMgO_4$ substrate 101 and the buffer layer 102, and eventually increasing the lattice mismatch ratio between the $ScAlMgO_4$ substrate 101 and the Group III nitride crystal 103. Therefore, there is an upper limit of the In proportion in the buffer layer 102 for suppressing the diffusion of Mg while retaining the crystallinity of the Group III nitride crystal 103.

Furthermore, in the production of an LED and an LD device, too large In content in the buffer layer 102 may cause absorption loss due to reduction of the band gap.

Accordingly, the band gap energy may be determined for reducing the absorption loss, for example, in the application of the Group III nitride semiconductor to an LED or an LD device having a light emission wavelength of 445 nm, which is generally widely used. Specifically, the In content may be determined to make the band gap energy of the buffer layer 102 of 2.8 eV or more, and in this case, the upper limit of the In content in the buffer layer 102 is preferably 50% by atom or less.

The lattice mismatch ratio between InAlGaN having an In content of 50% by atom and the $ScAlMgO_4$ substrate is approximately 3.4%, which is larger than the lattice mismatch ratio between the $ScAlMgO_4$ substrate and GaN of −1.8%. However, while InAlGaN having an In content of 50% by atom has a lattice coefficient that is larger than $ScAlMgO_4$, the value may not form cracks and the like in the Group III nitride crystal 103, and thus no serious problem may occur in the crystallinity of the Group III nitride crystal 103. Furthermore, in consideration of the lattice mismatch ratio between a sapphire substrate and the Group III nitride crystal of approximately 13.8%, it can be said that the lattice mismatch ratio between InAlGaN and the $ScAlMgO_4$ substrate (approximately 3.4%) is a sufficiently small value. The Al content in the buffer layer 102 is preferably 82% by atom or less from the standpoint of the reduction of the lattice mismatch ratio, and is more preferably 3% by atom.

The defect density at the interface between the buffer layer 102 and the $ScAlMgO_4$ substrate 101 can be obtained from the aforementioned lattice mismatch ratio and the defect density of the sapphire substrate. Specifically, the lattice mismatch ratio of the buffer layer 102 is approximately 3.4% at most, whereas the interface defect density between the sapphire substrate and GaN is approximately $1.0 \times 10^{11}$ cm$^2$, and the lattice mismatch ratio is approximately 13.8%. From these values, the defect density at the interface between the buffer layer 102 and the ScAlMgO$_4$ substrate 101 can be approximately $6.0 \times 10^9$ cm$^{-3}$ (($1.0 \times 10^{11}$)/(13.8/3.4)$^2$) at most.

In view of the above, by using the buffer layer 102 that contains InAlGaN having an In content of 50% by atom or less, the Group III nitride semiconductor with high quality, in which the diffusion of Mg into the Group III nitride crystal 103 is sufficiently suppressed, can be obtained. In consideration of the bowing parameter of InAlN reported in the reference literature ("Growth of AlInN Ternary Mixed Crystal System and Production and Evaluation of InN/AlInM MQWs Structure", Terashima, et al., IEICE Technical Report, ED, Electronic Devices, 105 (325), 29-34, 2005-10-06), the In content providing a band gap energy of 2.8 eV is approximately 40% by atom. Accordingly, in the case where the buffer layer 102 is a layer containing InAlGaN, it is considered that the In content is more preferably 40% by atom or less. When the In content is in the range, the absorption loss of energy can be suppressed, and the lattice mismatch ratio can be reduced.

Figure 3:
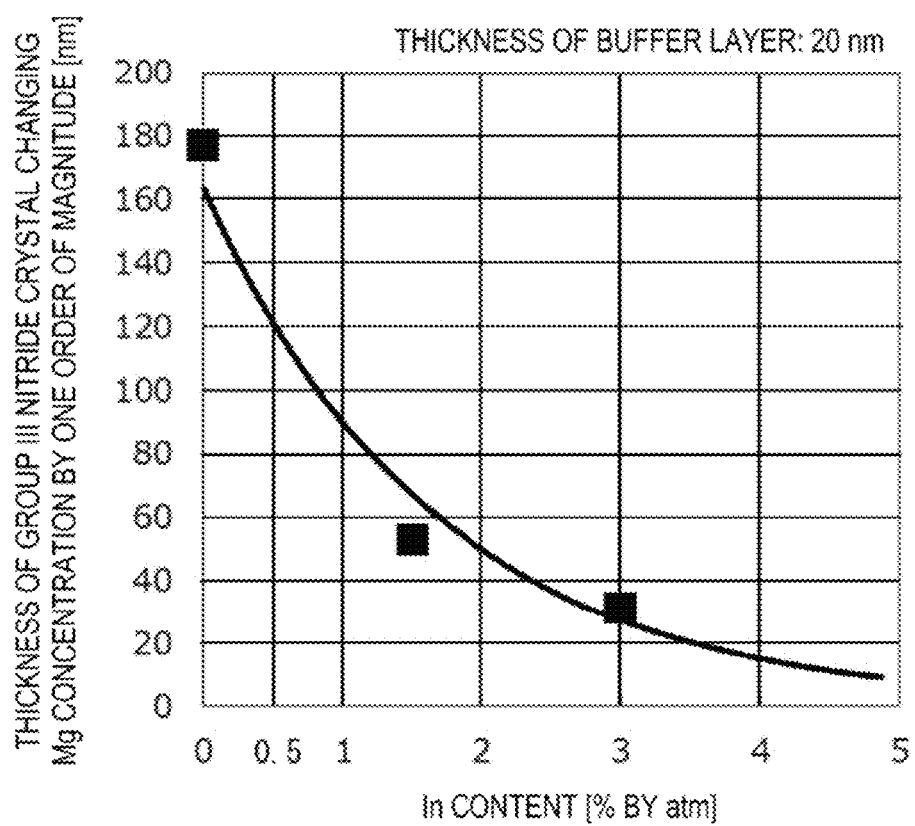
FIG. 3 is a graph showing the relationship between the In content in the buffer layer and the thickness of the Group III nitride crystal that changes the Mg concentration by one order of magnitude.

The lower limit of the In content of the buffer layer 102 will be described. FIG. 3 shows the relationship between the In content (composition) in the buffer layer and the thickness of the Group III nitride crystal 103 (i.e., GaN herein) that changes the Mg concentration by one order of magnitude in the Group III nitride semiconductor of the embodiment. In FIG. 3, the ordinate shows the thickness that changes the Mg concentration by one order of magnitude, and the abscissa shows the In content (% by atom) in the buffer layer. In FIG. 3, the thickness of the buffer layer 102 is a constant value of 20 nm for all the plots. As shown in FIG. 3, when the In content is 0.5% by atom or more, the thickness of the Group III nitride crystal 103 (GaN) that changes the Mg concentration by one order of magnitude can be 120 nm or less. The thickness of the Group III nitride crystal 103 in the production of devices is generally approximately several micrometers. When the thickness of the Group III nitride crystal 103 that changes the Mg concentration by one order of magnitude is 120 nm or less, Mg substantially does not appear on the surface of the Group III nitride crystal 103 (i.e., the region 103a in FIG. 1). Therefore, it is considered that by determining the lower limit of the In content in the buffer layer 102 to 0.5% by atom or less, the diffusion of Mg can be sufficiently suppressed, and the influence thereof on the device produced above the Group III nitride semiconductor can be suppressed.

In view of the above, the buffer layer 102 in the embodiment preferably contains In in an amount of 0.5% by atom or more and 50% by atom or less. The thickness of the buffer layer 102 is preferably 5 nm or more and 1,000 nm or less, and more preferably 10 nm or more and 100 nm or less.

The Group III nitride crystal 103 is a layer formed through epitaxial growth on the cleavage surface or the ScAlMgO$_4$ substrate 101 through the buffer layer 102, and is a layer formed of a nitride of a Group III element (such as Ga, Al, In, Tl, B, and Sc), which is preferably GaN.

The Mg concentration in the Group III nitride crystal 103 is preferably differentiated between the surface of the Group III nitride crystal 103 (i.e., the region 103a in FIG. 1) and the region of the Group III nitride crystal 103 on the side of the buffer layer 102. The region of the Group III nitride crystal 103 on the side of the buffer layer 102 (i.e., the region of the Group III nitride crystal 103 in the vicinity of the interface to the buffer layer 102) means a region of approximately 10% in the thickness direction of the Group III nitride crystal 103 on the side of the buffer layer 102. Specifically, the Mg concentration on the surface 103a of the Group III nitride crystal 103 is preferably smaller than the Mg concentration in the vicinity of the interface between the Group III nitride crystal 103 and the buffer layer 102, and the Mg concentration on the surface 103a of the Group III nitride crystal 103 is more preferably smaller than the Mg concentration at the interface between the Group III nitride crystal 103 and the buffer layer 102 by one or more orders of magnitude. Namely, the concentration of the element represented by M in the region of the Group III nitride crystal on the side of the buffer layer is preferably more than 10 times as much as the concentration of the element represented by M on the surface of the Group III nitride crystal. In the case where no impurity is added to the Group III nitride crystal 103 by doping or the like, the impurity concentration is preferably as small as possible, and for example, the Mg concentration on the surface 103a of the Group III nitride crystal 103 may be smaller than the Mg concentration at the interface between the Group III nitride crystal 103 and the buffer layer 102 by one or more orders of magnitude and four or less orders of magnitude. The Mg concentration on the surface of the Group III nitride crystal 103 and the Mg concentration in the vicinity of the interface between the Group III nitride crystal 103 and the buffer layer 102 each may be determined fey SIMS (secondary ion mass spectrometry). Mg is one example of the element M constituting the material represented by the general formula RAMO$_4$. Therefore, the concentration of the element represented by M in the general formula on the surface 103a of the Group III nitride crystal 103 is preferably smaller than the concentration of the element represented by M in the region of the Group III nitride crystal 103 on the side of the buffer layer 102. The concentration of the element represented by M on the surface 103a of the Group III nitride crystal 103 is more preferably smaller than the concentration of the element represented by M at the interface between the Group III nitride crystal 103 and the buffer layer 102 by one or more orders of magnitude. The interface between the Group III nitride crystal 103 and the buffer layer 102 can be determined, for example, by SIMS as a portion where the concentration gradient of In is drastically increased from the Group III nitride crystal 103 toward the buffer layer 102. M is inherently going to be diffused from the RAMO$_4$ substrate to the Group III nitride crystal 103, and therefore the concentration of M in the Group III nitride crystal 103 is decreased from the side of the buffer layer 102 toward the surface 103a. Accordingly, the concentration of M in the region of the Group III nitride crystal 103 positioned on the surface 103a in the thickness direction thereof is smaller than the concentration of M in the region thereof on the side of the buffer layer 102.

As described above, in the Group III nitride semiconductor of the embodiment, the diffusion of the element constituting the ScAlMgO$_4$ substrate 101 in the epitaxial growth of the Group III nitride to the Group III nitride crystal 103 is prevented by the buffer layer 102. Therefore, the Group III nitride crystal 103 with high quality can be obtained. In particular, the diffusion of Mg to the Group III nitride crystal tends to cause problems including deterioration of the crystallinity and reduction of the conductivity controllability thereof, but in the Group III nitride semiconductor of the embodiment, the diffusion of Mg contained in ScAlMgO$_4$ can be effectively prevented. Accordingly, the problems including deterioration of the crystallinity and reduction of the conductivity controllability of the Group III nitride crystal 103 are suppressed. The buffer layer 102 not only prevents the element constituting the ScAlMgO$_4$ substrate 101 as a seed substrate from being diffused, but also remedies the lattice mismatch in heteroepitaxy.

Method for Producing Group III Nitride Semiconductor

The method for producing the Group III nitride semiconductor of the embodiment is not particularly limited. For example, the buffer layer 102 and the Group III nitride crystal 103 can be formed by epitaxially growing a Group III nitride on the ScAlMgO$_4$ substrate 101 by an MOCVD (metal-organic chemical vapor deposition) method.

In the case where the buffer layer 102 and the Group III nitride crystal 103 are formed by an MOCVD method, examples of the Group III element source used include trimethylgallium (TMG), trimethylindium (TMI), and trimethylaluminum (TMA). Examples of the nitrogen source therefor include ammonia (NH$_3$) gas. Examples of the carrier gas for performing the MOCVD method include hydrogen and nitrogen.

Before performing the MOCVD method, the ScAlMgO$_4$ substrate 101 is preferably subjected to thermal cleaning, for example, at 1,100° C. for 10 minutes in a hydrogen atmosphere. The thermal cleaning performed removes carbonaceous contamination and the like on the surface of the substrate. After the cleaning, the surface temperature of the ScAlMgO$_4$ substrate 101 is decreased, for example, to 425° C. A nitride of In and a Group III element except for In is accumulated on the ScAlMgO$_4$ substrate 101 by the MOCVD method to form the buffer layer 102. The buffer layer 102 may be generally formed at a relatively low temperature of 400° C. or more and less than 700° C. When the buffer layer 102 is formed at such a low temperature, the buffer layer 102 becomes an amorphous or polycrystalline layer, by which lattice defects are prevented from being formed in the Group III nitride crystal 103 formed on the buffer layer 102. The thickness and the composition of the buffer layer 102 can be controlled by the film forming time and the proportions of the raw materials.

After forming the buffer layer 102, the temperature of the ScAlMgO$_4$ substrate 101 is increased, for example, to 1,125° C., on which a Group III nitride is epitaxially grown to provide the Group III nitride crystal 103. The thickness and the composition of the Group III nitride crystal 103 can also be controlled by the film forming time and the proportions of the raw materials. The temperature, at which the Group III nitride crystal 103 is formed, may be 700° C. or more and 1,300° C. or less. The epitaxial growth of the Group III nitride at that temperature may facilitate the formation of the Group III nitride crystal 103 having less lattice defects.

Others

In the Group III nitride semiconductor of the embodiment, the ScAlMgO$_4$ substrate 101 may be constituted by a substantially sole crystal material represented by the general formula RAMO$_4$. In the general formula, R represents one or a plurality of trivalent elements selected from Sc, In, Y, and a lanthanoid element (atomic number: 67 to 71), A represents one or a plurality of trivalent elements selected from Fe(III), Ga, and Al, and M represents one or a plurality of divalent elements selected from Mg, Mn, Fe(II), Co, Cu, Zn, and Cd. The substantially sole crystal material herein means a crystalline solid, in which 90% by atom or more of RAMO$_4$ constituting the epitaxial growth surface is contained, and in terms of an arbitrary crystal axis, the direction of the crystal axis is not changed in any part on the epitaxial growth surface. However, a material having a crystal axis that is locally changed in direction thereof and a material containing local lattice defects are handled as a single crystal. O represents oxygen. As described above, it is preferred that R is Sc, A is Al, and M is Mg.

While the Group III element constituting the buffer layer 102 and the Group III nitride crystal 103 is particularly preferably gallium (Ga) as described above, for example, only one selected from aluminum (Al), indium (In), thallium (Tl), and the like may be used, and two or more selected therefrom may be used in combination. For example, as a material constituting the Group III nitride crystal 103, at least one selected from the group consisting of aluminum (Al), gallium (Ga), and indium (In) may be used. In this case, the composition of the Group III nitride crystal 103 thus produced can be represented by Al$_s$Ga$_t$In$_{(1-(s+t))}$N (wherein 0≤s≤1, 0≤t≤1, and s+t≤1). The Group III nitride crystal 103 may contain a dopant material and the like present therein. The dopant is not particularly limited, and examples thereof include germanium oxide (such as Ge$_2$O$_3$ and Ge$_2$O).

Examples of the epitaxial growth method for forming the Group III nitride crystal 103 include an HVPE method, an OVPE method, a sputtering method, and an MBE method, in addition to the MOCVD method.

EXAMPLE

Example 1

As Example 1 a Group III nitride semiconductor was produced that contained an ScAlMgO$_4$ substrate 101, a buffer layer 102 formed on the ScAlMgO$_4$ substrate 101, the buffer layer formed of amorphous or polycrystalline InGaN containing 3% by atom of In having a thickness of 20 nm, and a Group III nitride crystal 103 formed on the buffer layer 102, formed of a single crystal of GaN having a thickness of 2 µm. The Group III nitride semiconductor was produced by the aforementioned production method, and the growing speed of the Group III nitride crystal 103 was 3 µm/hour.

In the Group III nitride semiconductor of Example 1, Mg in the ScAlMgO$_4$ substrate 101 is suppressed from being diffused in the Group III nitride crystal 103 by the buffer layer 102 containing In.

Comparative Example 1

Figure 4:
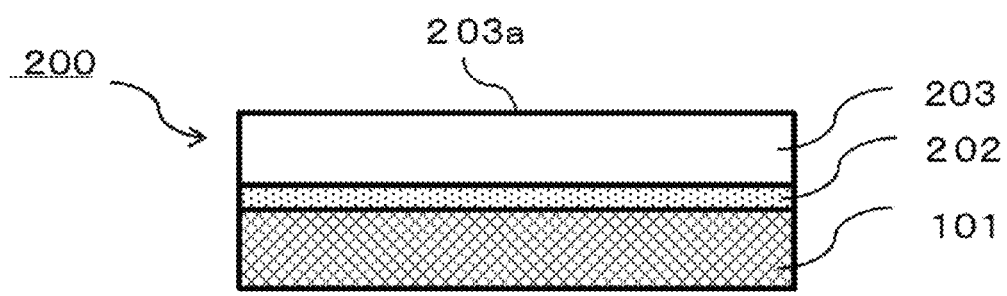
FIG. 4 is a schematic cross sectional view showing a Group III nitride semiconductor in Comparative Example.

For confirming that the diffusion of Mg was suppressed in Example 1, a Group III nitride semiconductor for comparison was prepared. FIG. 4 shows the structure of the Group III nitride semiconductor for comparison (which may be hereinafter referred to as a "comparative semiconductor"). For the comparative semiconductor 200, a Group III nitride semiconductor was produced that contained, an ScAlMgO$_4$ substrate 101, a GaN amorphous layer 202 formed on the ScAlMgO$_4$ substrate 101, containing no In and having a thickness of 20 nm, and a Group III nitride crystal 203 formed on the GaN amorphous layer 202, formed of GaN having a thickness of 2 µm. The Group III nitride crystal 203 of the comparative semiconductor 200 was a layer that was formed by epitaxial growth on the ScAlMgO$_4$ substrate 101 through the GaN amorphous layer 202.

Comparison Between Example 1 and Comparative Example 1

Figure 5:
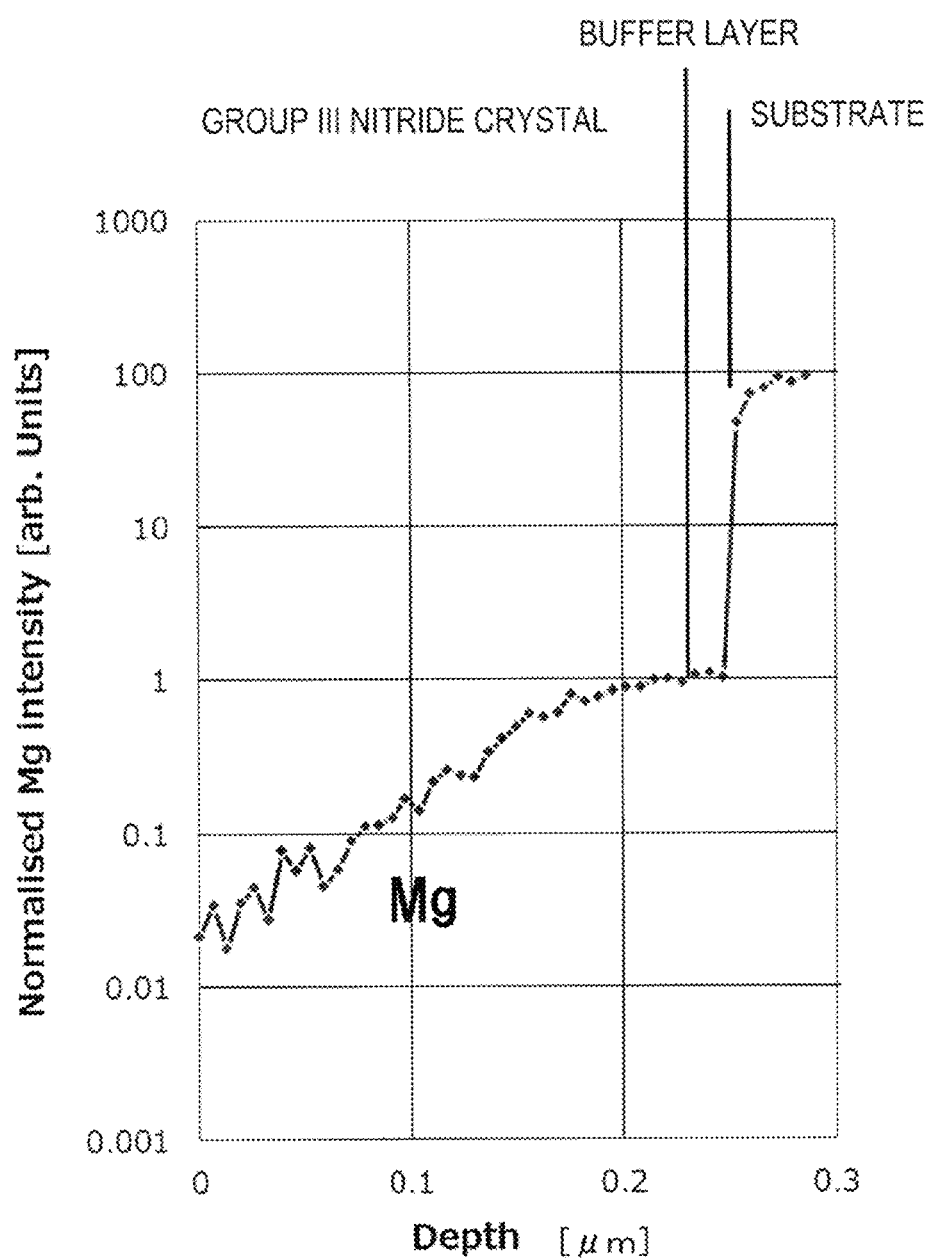
FIG. 5 is a graph showing the change of the Mg concentration in the Group III nitride semiconductor in Comparative Example.

FIG. 5 shows the result of SIMS (secondary ion mass spectrometry) of the comparative semiconductor. According to the SIMS, the diffusion of Mg from the ScAlMgO$_4$ substrate 101 to the Group III nitride crystal 203 is confirmed. In FIG. 5, the ordinate shows the Mg intensity (arb. units) measured in the SIMS, i.e., the Mg concentration, and the abscissa shows the depth (μm) of the Group III nitride crystal 203 from the surface 203a. For measuring the data of the region of the Group III nitride crystal 203 in the vicinity of the GaN amorphous layer 202, the Group III nitride crystal 203 having a thickness of 2 μm is etched from the surface 203a to reduce the thickness thereof to 0.25 μm, and then subjected to the SIMS. As shown in the graph in FIG. 5, in the Group III nitride crystal 203 of the comparative semiconductor 200, the Mg concentration is increased as becoming closer to the ScAlMgO$_4$ substrate 101. This means that in the comparative semiconductor 200, Mg is diffused from the ScAlMgO$_4$ substrate 101 to the Group III nitride crystal 203. In the comparative semiconductor 200, furthermore, a thickness of approximately 177 nm is required for decreasing the Mg intensity to $\frac{1}{10}$ from the position with the largest Mg intensity in the Group III nitride crystal 203.

Figure 6:
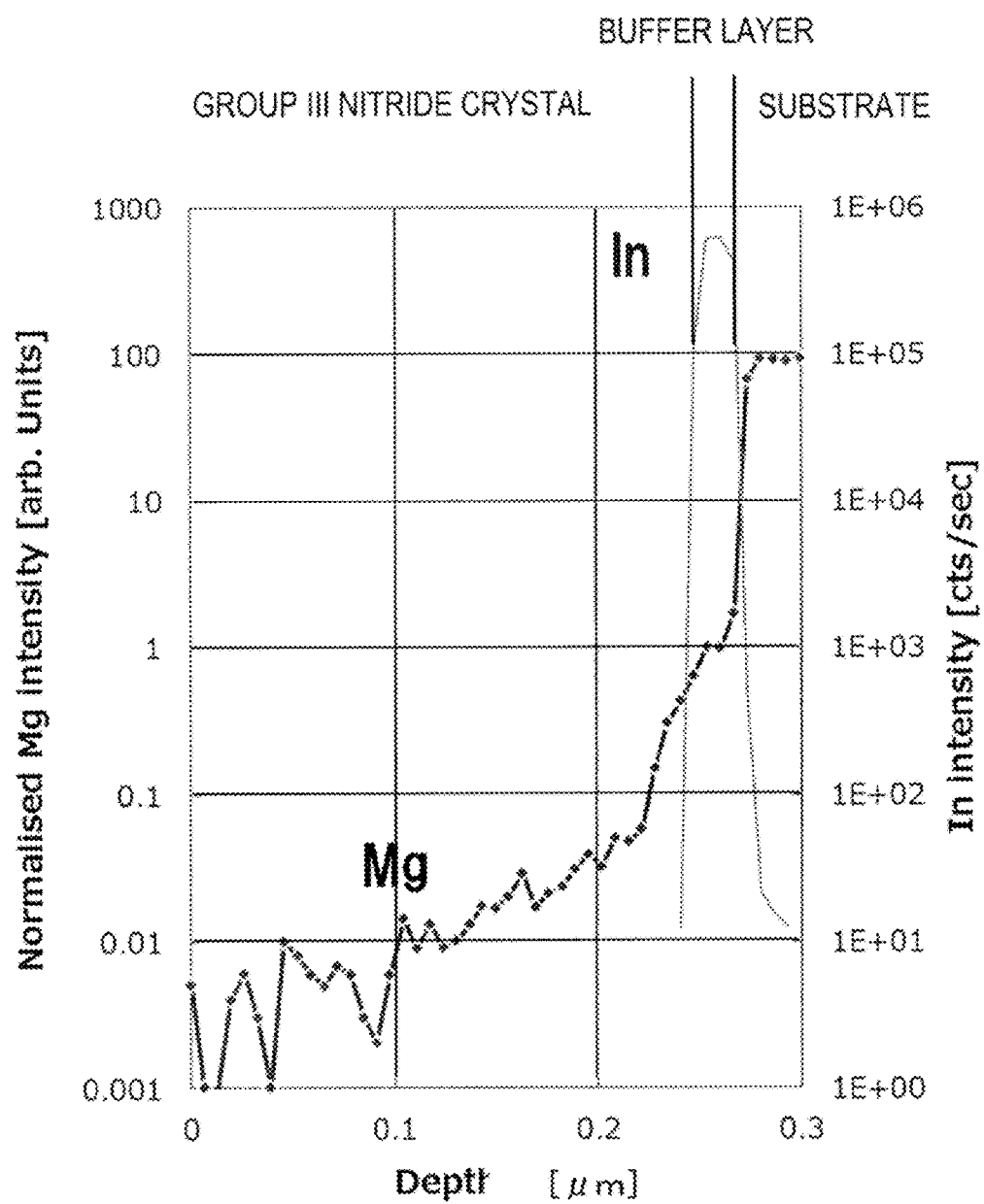
FIG. 6 is a graph showing the change of the Mg concentration and the change of the In concentration in the Group III nitride semiconductor in Example 1.

FIG. 6 shows the result of SIMS of the Group III nitride semiconductor of Example 1. In FIG. 6, the left ordinate shows the Mg intensity (arb. units), the right ordinate shows the In intensity (cts/sec), and the abscissa shows the depth (μm) of the Group III nitride crystal 103 from the surface 103a. For measuring the data of the region of the Group III nitride crystal 103 in the vicinity of the buffer layer 102, the Group III nitride crystal 103 having a thickness of 2 μm is etched from the surface 103a to reduce the thickness thereof to 0.25 μm, and then subjected to the SIMS. In the Group III nitride crystal 103 of the Group III nitride semiconductor of Example 1, the Mg concentration is also increased as becoming closer to the ScAlMgO$_4$ substrate 101. This means that the diffusion of Mg to the Group III nitride crystal 103 is confirmed. However, the thickness required for decreasing the Mg intensity to $\frac{1}{10}$ from the position with the largest Mg intensity in the Group III nitride crystal 103 is approximately 31 nm, and it can be said that the diffusion of Mg is significantly suppressed as compared to the comparative semiconductor.

It is apparent from the result that with the buffer layer 102 containing the nitride (InGaN) of In and a Group III element except for In (Ga), the diffusion of Mg to the Group III nitride crystal 103 formed on the ScAlMgO$_4$ substrate 101 can be suppressed. Accordingly, in the Group III nitride semiconductor of the embodiment, it can be said that the Group III nitride crystal 103 (i.e., the GaN epitaxial film) has good crystallinity, and the conductivity controllability and the like can be easily enhanced with the Group III nitride semiconductor.

Figure 7:
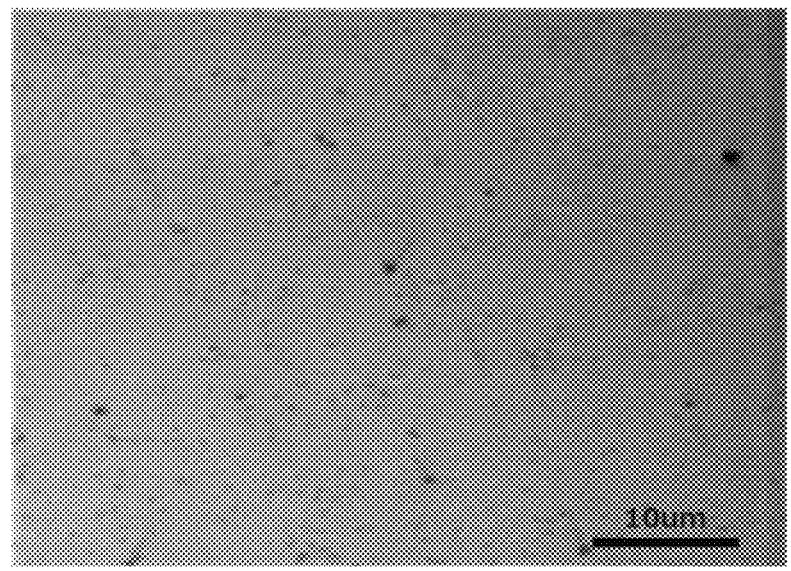
FIG. 7 is a figure showing the result of surface cathode luminescence of the Group III nitride semiconductor in Example 1.

FIG. 7 shows the evaluation result of cathode luminescence (CL) of the surface 103a of the Group III nitride crystal 103 of Example 1 at room temperature. The thickness of the Group III nitride crystal 103 of Example 1 is 2 μm. In the CL, the acceleration voltage was 5 kV, and the irradiation current was 5 nA. In FIG. 7, the regions observed as a dark dots can be considered portions where crystal dislocation occurs. As a result of estimation of the dislocation from the evaluation result, the dislocation density was $6.0 \times 10^7$ cm$^{-2}$.

A group III nitride crystal that is epitaxially grown on an ordinary sapphire substrate as a seed substrate generally has a dislocation density of from $1 \times 10^{10}$ to $1 \times 10^{11}$ cm$^{-2}$. Accordingly, it is understood that Example 1 provides the Group III nitride crystal 103 that has a small dislocation density.

In the Group III nitride semiconductor of Example 1, the lattice mismatch ratio between the ScAlMgO$_4$ substrate 101 and the Group III nitride crystal 103 (GaN) is approximately −1.4%. By controlling the lattice mismatch ratio to approximately $\frac{1}{10}$ of −1.8%, which is the ordinary lattice mismatch ratio of GaN and an ScAlMgO$_4$ substrate, by adjusting the composition of the buffer layer 102, the dislocation density can be reduced to approximately $1.0 \times 10^6$ cm$^{-2}$ (($6.0 \times 10^7$)/$(-1.4/-0.18)^2$).

Example 2

As Example 2, a Group III nitride semiconductor was produced that contained an ScAlMgO$_4$ substrate 101, a buffer layer 102 formed on the ScAlMgO$_4$ substrate 101, formed of amorphous or polycrystalline InGaN containing 1.5% by atom of In having a thickness of 20 nm, and a Group III nitride crystal 103 formed on the buffer layer 102, formed of a single crystal of GaN having a thickness of 2 μm.

Figure 8:
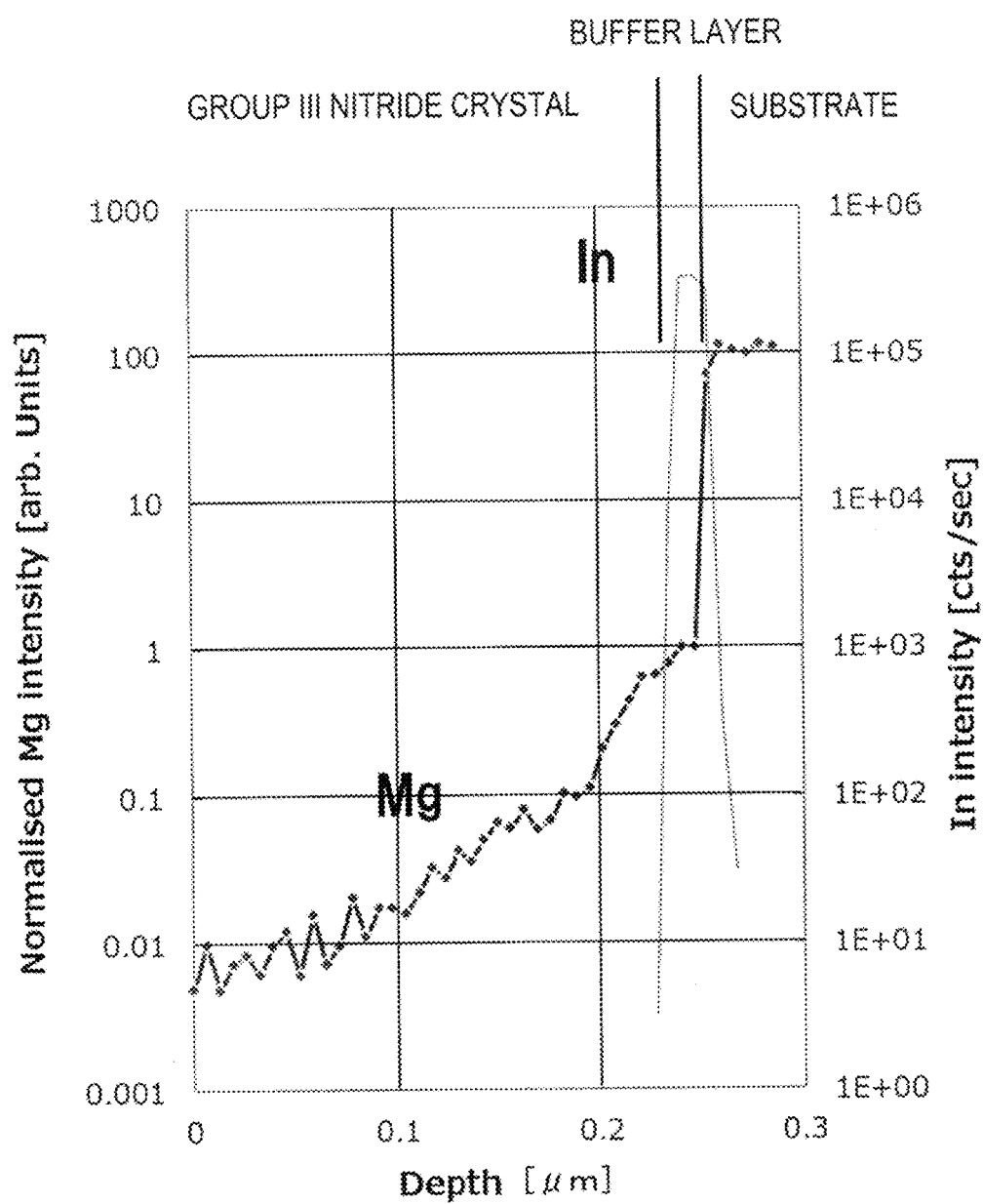
FIG. 8 is a graph showing the change of the Mg concentration and the change of the In concentration in the Group III nitride semiconductor in Example 2.

FIG. 8 shows the result of the SIMS analysis in Example 2. In FIG. 8, the left ordinate shows the Mg intensity (arb. units), the right ordinate shows the In intensity (cts/sec), and the abscissa shows the depth, (μm) of the Group III nitride crystal 103 from the surface 103a. For measuring the data of the region of the Group III nitride crystal 103 in the vicinity of the buffer layer 102, the Group III nitride crystal 103 having a thickness of 2 μm is etched from the surface 103a to reduce the thickness thereof to 0.25 μm, and then subjected to the SIMS. In the Group III nitride crystal 103 of Example 2, the Mg concentration is also increased as becoming closer to the ScAlMgO$_4$ substrate 101. This means that the diffusion of Mg to the Group III nitride crystal 103 is confirmed. However, the thickness required for decreasing the Mg intensity to $\frac{1}{10}$ from the position with the largest Mg intensity in the Group III nitride crystal 103 is approximately 53 nm, and it can be said that the diffusion of Mg is significantly suppressed as compared to the comparative semiconductor, Therefore, it is understood that the effect of suppressing Mg diffusion can be obtained in the case where the buffer layer 102 has an In content of 1.5% by atom.

Example 3

As Example 3, a Group III nitride semiconductor was produced that contained an ScAlMgO$_4$ substrate 101, a buffer layer 102 formed on the ScAlMgO$_4$ substrate 101, the buffer layer formed of amorphous or polycrystalline InGaN containing 3% by atom of In having a thickness of 10 nm, and a Group III nitride crystal 103 formed on the buffer layer 102, formed of a single crystal of GaN having a thickness of 2 μm.

Figure 9:
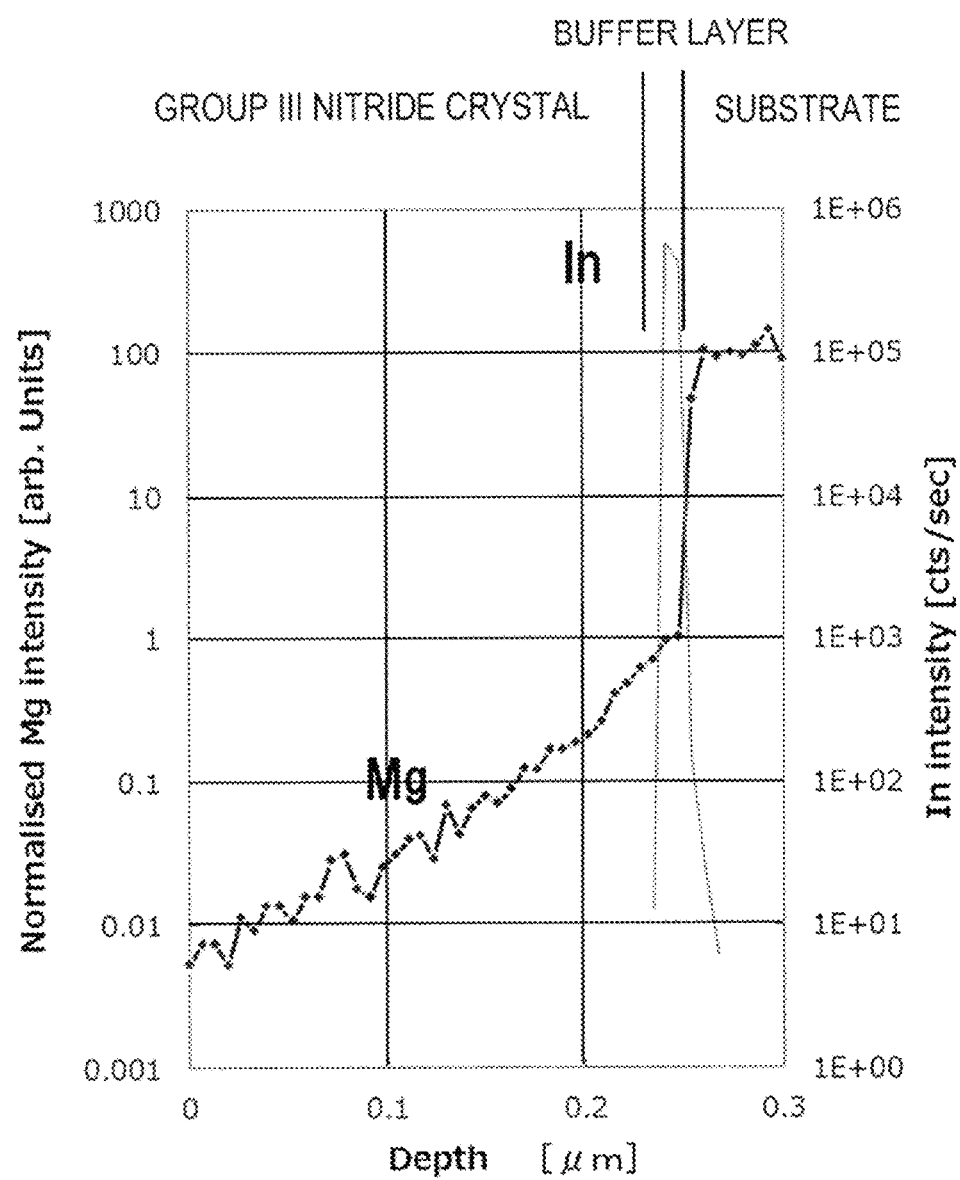
FIG. 9 is a graph showing the change of the Mg concentration and the change of the In concentration in the Group III nitride semiconductor in Example 3.

FIG. 9 shows the result of the SIMS analysis in Example 3. In FIG. 9, the left ordinate shows the Mg intensity (arb. units), the right ordinate shows the In intensity (cts/sec), and the abscissa shows the depth, (μm) of the Group III nitride crystal 103 from the surface 103a. For measuring the data of the region in the vicinity of the buffer layer 102, the Group III nitride crystal 103 having a thickness of 2 μm is etched from the surface 103a to reduce the thickness thereof to 0.25 μm, and then subjected to the SIMS. In the Group III nitride crystal 103 of Example 3, the Mg concentration is also increased as becoming closer to the ScAlMgO$_4$ substrate 101. This means that the diffusion of Mg to the Group III nitride crystal 103 is confirmed. However, the thickness required for decreasing the Mg intensity to $\frac{1}{10}$ from the position with the largest Mg intensity in the Group III nitride crystal 103 is approximately 80 nm, and it can be said that the diffusion of Mg is significantly suppressed as compared to the comparative semiconductor. Therefore, even in the case where the thickness of the buffer layer 102 is as relatively small as 10 nm, the effect of suppressing Mg diffusion can be obtained.

Example 4

The Group III nitride semiconductor of Example 4 contains an ScAlMgO$_4$ substrate 101, a buffer layer 102 formed on the ScAlMgO$_4$ substrate 101, the buffer layer formed of amorphous or polycrystalline InGaAlN containing 1% by atom of In and 3% by atom of Al having a thickness of 10 nm, and a Group III nitride crystal 103 formed on the buffer layer 102, formed of a single crystal of GaN having a thickness of 2 μm.

Figure 10:
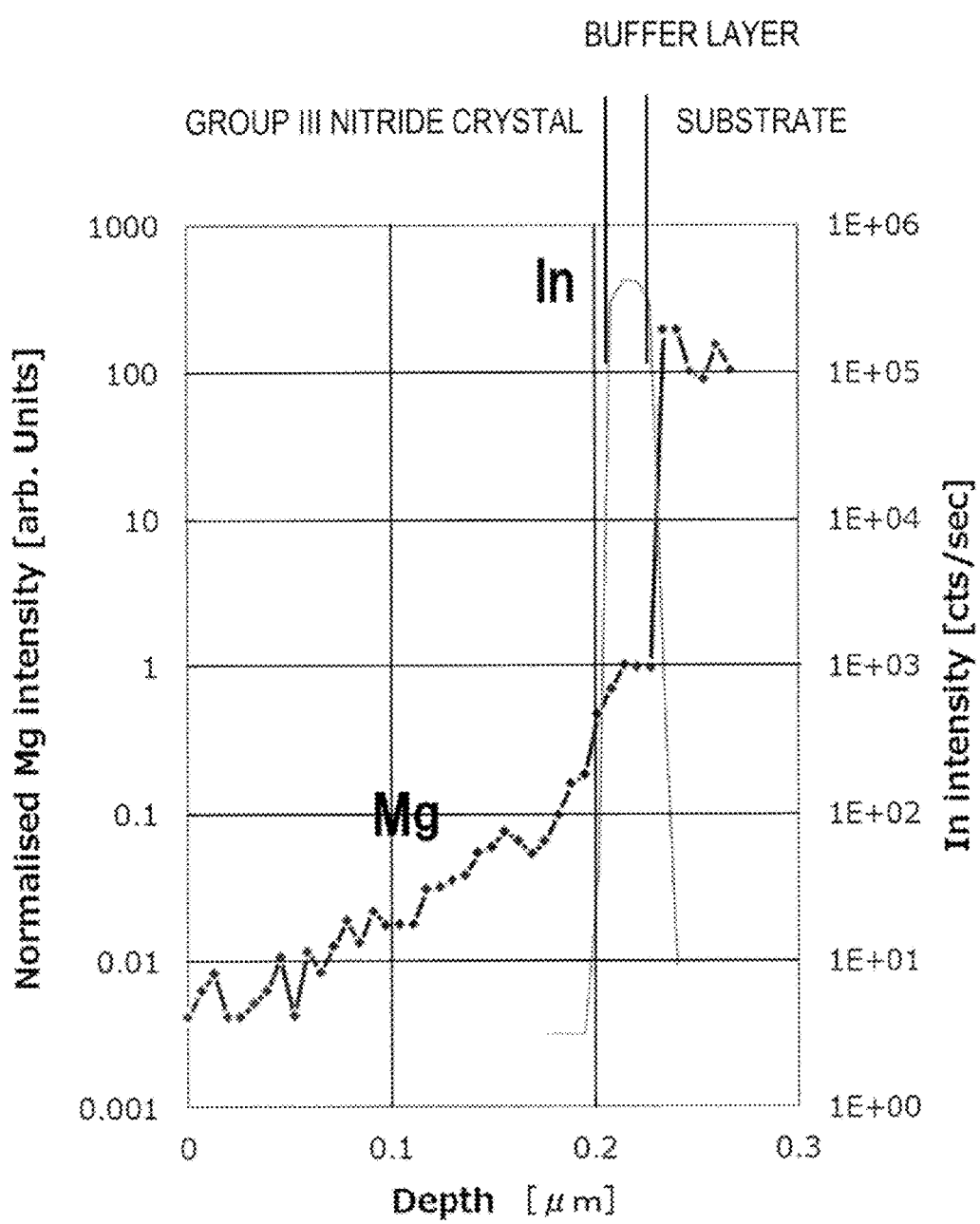
FIG. 10 is a graph showing the change of the Mg concentration and the change of the In concentration in the Group III nitride semiconductor in Example 4.

FIG. 10 shows the result of the SIMS analysis in Example 4. In FIG. 10, the left ordinate shows the Mg intensity (arb. units), the right ordinate shows the In intensity (cts/sec), and the abscissa shows the depth (μm) of the Group III nitride crystal 103 from the surface 103a. For measuring the data of the region of the Group III nitride crystal 103 in the vicinity of the buffer layer 102, the Group III nitride crystal 103 having a thickness of 2 μm is etched from the surface 103a to reduce the thickness thereof to 0.25 μm, and then subjected to the SIMS. In the Group III nitride crystal 103 of Example 4, the Mg concentration is also increased as becoming closer to the ScAlMgO$_4$ substrate 101. This means that the diffusion of Mg to the Group III nitride crystal 103 is confirmed. However, the thickness required for decreasing the Mg intensity to $\frac{1}{10}$ from the position with the largest Mg intensity in the Group III nitride crystal 103 is approximately 33 nm, and there is no significant influence of the addition of Al on the diffusion of Mg.

In Examples 1 to 4, Mg is inherently going to be diffused from the ScAlMgO$_4$ substrate 101 to the Group III nitride crystal 103, and therefore the Mg concentration in the Group III nitride crystal 103 is decreased from the side of the buffer layer 102 toward the surface 103a. Accordingly, the Mg concentration on the surface 103a of the Group III nitride crystal 103 is smaller than the Mg concentration in the region thereof on the side of the buffer layer 102.

The Group III nitride on the hetero-substrate of the embodiment has a small lattice mismatch ratio, and is a high-quality and high-performance Group III nitride with suppressed impurity diffusion from the hetero-substrate.

What is claimed is:

1. A Group III nitride semiconductor comprising:
   a RAMO$_4$ substrate containing a single crystal represented by the general formula RAMO$_4$, wherein-R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd;
   a layer disposed on the RAMO$_4$ substrate, the buffer layer containing a nitride of In and a Group III element except for In; and
   a Group III nitride crystal disposed on the layer,
   wherein a concentration of an element represented by M in the general formula on a surface of the Group III nitride crystal is smaller than a concentration of the element represented by M in a region of the Group III nitride crystal on a side of the layer.

2. The Group III nitride semiconductor according to claim 1, wherein the layer contains In in an amount of 0.5% by atom or more and 50% by atom or less.

3. The Group III nitride semiconductor according to claim 1, wherein in the general formula, R is Sc, A is Al, and M is Mg.

4. The Group III nitride semiconductor according to claim 1, wherein the layer further contains Al.

5. The Group III nitride semiconductor according to claim 1, wherein the Group III nitride crystal is GaN.

6. The Group III nitride semiconductor according to claim 1, wherein the layer has a thickness of 5 nm or more and 1,000 nm or less.

7. The Group III nitride semiconductor according to claim 1, wherein
   the concentration of the element represented by M in the region of the Group III nitride crystal on the side of the layer is more than 10 times as much as the concentration of the element represented by M on the surface of the Group III nitride crystal.

8. A method for producing a Group III nitride semiconductor, comprising:
   preparing an RAMO$_4$ substrate containing a single crystal represented by the general formula RAMO$_4$, wherein R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd;
   forming a layer containing a nitride of In and a Group III element except for In, on the RAMO$_4$ substrate; and
   forming a Group III nitride crystal on the layer,
   wherein a concentration of an element represented by M in the general formula on a surface of the Group III nitride crystal is smaller than a concentration of the element represented by M in a region of the Group III nitride crystal on a side of the layer.

9. The method for producing a Group III nitride semiconductor according to claim 8, wherein the layer contains In in an amount of 0.5% by atom or more and 50% by atom or less.

10. The method for producing a Group III nitride semiconductor according to claim 8, wherein the layer further contains Al.

11. The method for producing a Group III nitride semiconductor according to claim 8, wherein in the general formula, R is Sc, A is Al, and M is Mg.

12. The method for producing a Group III nitride semiconductor according to claim 8, wherein the Group III nitride crystal is GaN.

\* \* \* \* \*